United States Patent [19]

Nagata et al.

[11] Patent Number: 5,066,972
[45] Date of Patent: Nov. 19, 1991

[54] IMAGE FORMING APPARATUS WITH POSITIONAL ADJUSTMENT OF EXPOSURE AREA ACCORDING TO IMAGE SIZE

[75] Inventors: Osamu Nagata, Aichi; Kazumasa Makino, Nagoya, both of Japan

[73] Assignee: Brother Kogyo Kabushiki Kaisha, Japan

[21] Appl. No.: 630,509

[22] Filed: Dec. 20, 1990

[30] Foreign Application Priority Data

Dec. 29, 1989 [JP] Japan ............................. 1-151433[U]

[51] Int. Cl.$^5$ ............................................. G03B 27/52
[52] U.S. Cl. ...................................... 355/27; 355/77; 355/45; 355/43
[58] Field of Search ....................... 355/27, 28, 43, 45, 355/77, 55, 56

[56] References Cited

U.S. PATENT DOCUMENTS 4,782,361 11/1988 Spinelli et al. ..................... 355/56 X Primary Examiner—L. T. Hix
Assistant Examiner—D. Rutledge
Attorney, Agent, or Firm—Oliff & Berridge

[57] ABSTRACT

A slide printer exposes an elongated microcapsule sheet to a light image in an exposure position, and, thereafter, a pressure development unit forms a visible output image on a developer sheet superposed with the exposed portion of the microcapsule sheet. The slide printer includes two light paths which are provided between a slide projector and an exposure stand in the exposure position and switched by a movable reflector according to a selected one of A4 size and A3 size of the developer sheet. A first and second exposure area to be exposed to the light image are selectively set on the microcapsule sheet in the exposure stand. The second exposure area corresponding to A4 size is arranged within the first exposure area corresponding to A3 size and in the nearest position to the development unit in a feed path of the microcapsule sheet, thereby preventing an unexposed portion of the microcapsule sheet from being left on the side close to the development unit of the second exposure area.

18 Claims, 6 Drawing Sheets

IMAGE FORMING APPARATUS WITH POSITIONAL ADJUSTMENT OF EXPOSURE AREA ACCORDING TO IMAGE SIZE

BACKGROUND OF THE INVENTION

1. Field of the Invention

This invention relates to an image forming apparatus which exposes a photosensitive recording medium to a light image such that its size is enlarged, reduced or unchanged, and forms an image on a recording output sheet.

2. Description of Related Art

One well known image forming apparatus which enables image size adjustment comprises a slide printer which enlarges an image recorded in a slide and prints the enlarged image on an output sheet of a predetermined size.

In the slide printer, as shown in FIG. 6, a reflector B is arranged obliquely with respect to a projection direction of a light image from a slide projector A, thereby rendering the printer compact. A photosensitive recording medium comprising a microcapsule sheet C is exposed to the light image reflected by the reflector B. The exposed microcapsule sheet C having a latent image formed thereon is fed to a pressure development part D for pressurizing the microcapsule sheet superposed with an output sheet, a visible image being formed on the output sheet.

In the slide printer, when an output image having a changed size is printed on the output sheets of different sizes, the length of a light path from the slide projector A to the reflector B is changed by moving the slide projector A back and forth. An exposure area on the microcapsule sheet C is thus adjusted thereby.

Because the reflector B is placed at a fixed position in the above-mentioned slide printer, the exposure area on the microcapsule sheet C has a definite extent corresponding to the size of the output sheet, the area being centered on a fixed point. That is, as shown in FIG. 6, if the size of the output sheet is an A4 size, its exposure area is provided within the exposure area of the A3 size and centers on the same point as the center of the exposure area of the A3 size.

When the size of the output sheet is smaller than a maximum size possible to be recorded, (e.g., the output sheet is the A4 size which is smaller than the maximum A3 size) an area from a leading edge (line a-d shown in FIG. 6) of a non-exposure part of the microcapsule sheet C to an edge (line b-c shown in FIG. 6) at which the exposure starts (area enclosed with a,b,c,d in FIG. 6) is fed to the development part D without being exposed, and the microcapsule sheet C is used wastefully.

SUMMARY OF THE INVENTION

In order to solve the above drawbacks of the image forming apparatus, it is an object of the present invention to provide an image forming apparatus which can prevent an area of the photosensitive recording medium from being unused and which can use the photosensitive recording medium effectively.

To achieve the object, the image forming apparatus according to this invention comprises: means for storing an elongated photosensitive recording medium; feed means for feeding the photosensitive recording medium from the storing means along a predetermined feed path; exposure means for exposing the photosensitive recording medium to a light image, the exposure means having an exposure position downstream of the storing means in the feed path; development means, disposed downstream of the exposure position in the feed path, for developing an exposed portion of the photosensitive recording medium to form a visible output image; size selection means for selecting a desired size of the visible output image from among a first image size and at least one second image size smaller than the first image size; first light path setting means for leading the light image to the photosensitive recording medium, the first light path setting means being placed at the exposure position when the first image size is selected by size selection means and for setting a first exposure area to be exposed to the light image corresponding to the first image size on the photosensitive recording medium; and second light path setting means for leading the light image to the photosensitive recording medium, the second light path setting means being placed at the exposure position when the second image size is selected by the size selection means and for setting a second exposure area to be exposed to the light image corresponding to the second image size on the photosensitive recording medium so that the second exposure area is arranged within the first exposure area and in the nearest position to the development means in the feed path.

According to the image forming apparatus of this invention, when the photosensitive recording medium is exposed to the light image, if the first image size larger than the second image size is selected by the size selection means as a size of the visible output image, the light image is led to the photosensitive recording medium by the first light path setting means, and the first exposure area which corresponds to the first image size is set on the photosensitive recording medium in the exposure position. On the other hand, if the second image size smaller than the first image size is selected in the size selection means, the light image is led to the photosensitive recording medium by the second light path setting means, and the second exposure area which corresponds to the second image size is set on the photosensitive recording medium in the exposure position so that the second exposure area is arranged within the first exposure area and in the nearest position to the development means in the feed path of the photosensitive recording medium.

Therefore, according to the image forming apparatus of this invention, even if the second image size smaller than the first image size is selected, any unexposed portion of the photosensitive recording medium is never left on the side close to the development means of the second exposure area, because the second exposure area which corresponds to the second image size is formed within the first exposure area which corresponds to the first image size and in the nearest position to the development means in the feed path of the photosensitive recording medium. As a result, according to this invention, the nonuse of the photosensitive recording medium can be prevented and the photosensitive recording medium can be used effectively.

BRIEF DESCRIPTION OF THE DRAWING

A preferred embodiment of the present invention will be described in detail with reference to the following drawings wherein.

DETAILED DESCRIPTION OF THE PREFERRED EMBODIMENT

Hereafter, one embodiment of this invention will be described with reference to the drawings. This invention is embodied in a slide printer provided with an image forming apparatus.

According to the slide printer of this embodiment, both of two sizes, the A3 size and the A4 size, can be printed. The entire constitution of the slide printer is shown in FIG. 1, FIG. 2(A), and FIG. 2(B).

As shown in these figures, a slide having an image of scenery or characters thereon is mounted on a slide printer 1 including a slide projector 2 for outputting the image of the slide and a filter unit 3 which is arranged in front of the slide projector 2.

Figure 1:
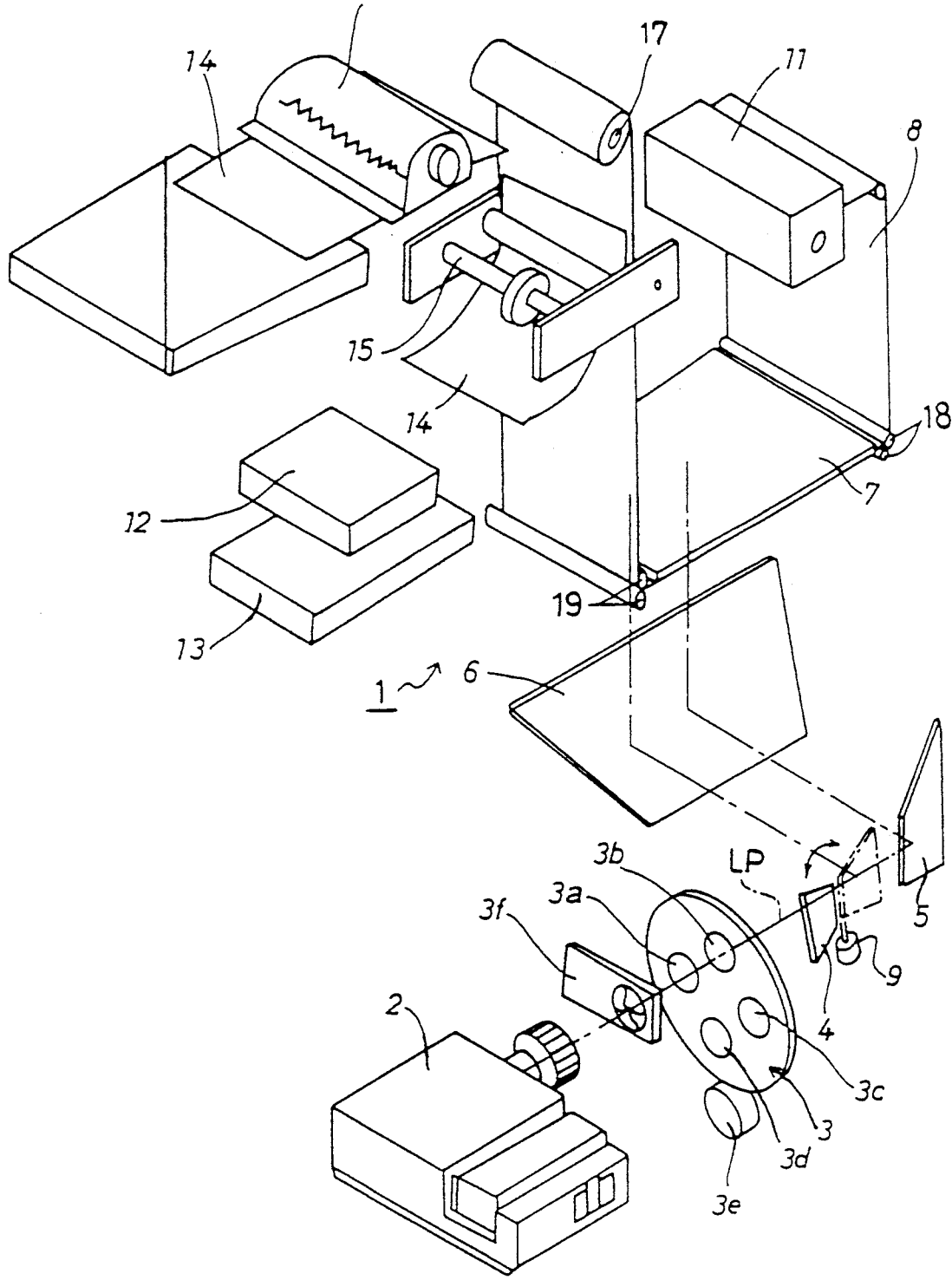
FIG. 1 is a perspective view showing a slide printer equipped with an image forming apparatus according to an embodiment of this invention.
Figure 2:
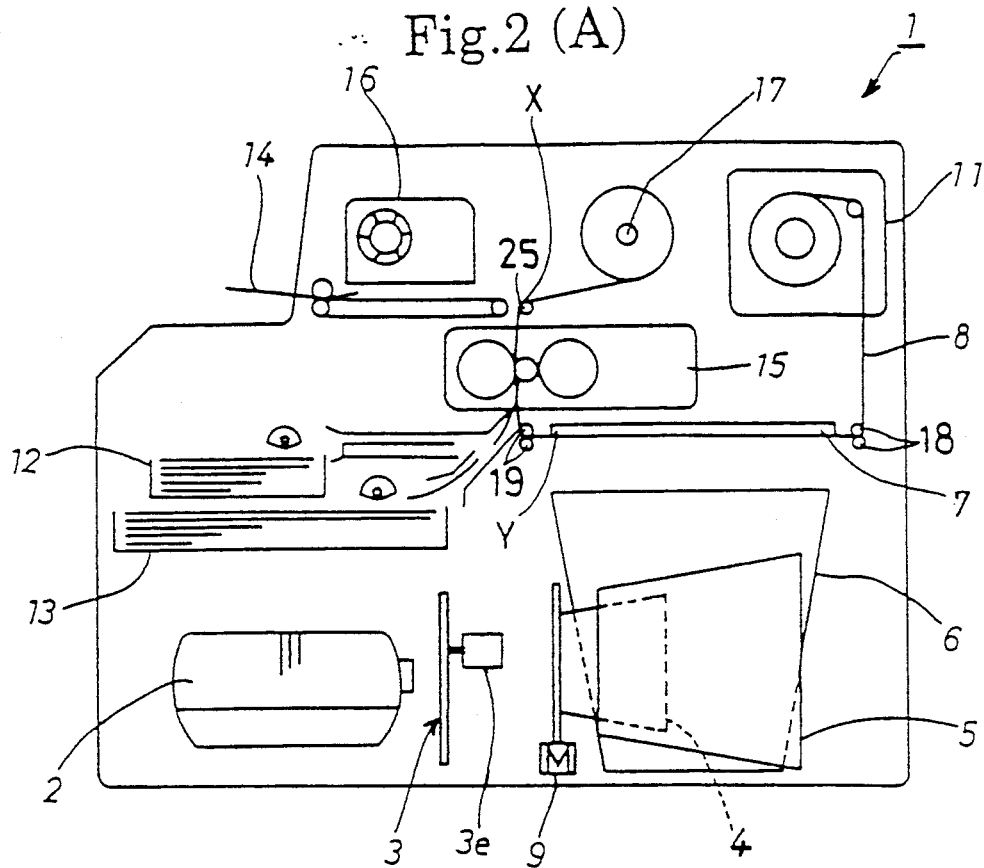
FIG. 2(A) is a schematic sectional elevational view showing the slide printer.
FIG. 2(B) is a schematic sectional plan view showing the arrangement of two reflectors in the slide printer.
Figure 2:
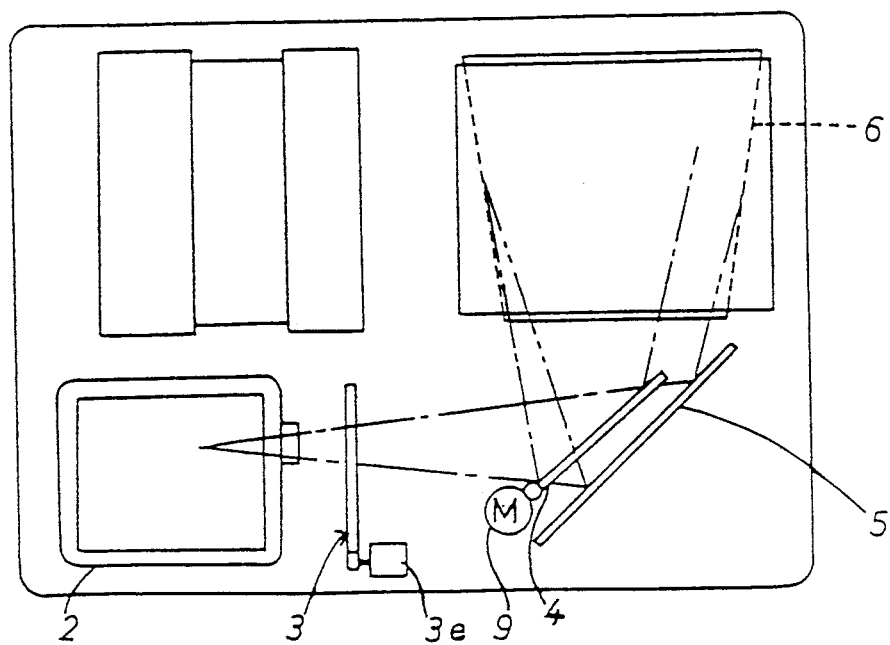

As shown in FIG. 1, the filter unit 3 has four windows 3a, 3b, 3c and 3d and four kinds of filters, that is yellow, magenta, cyanogen and transparence, are installed on each window. This filter unit 3 is driven by a filter motor 3e, and can project one light image four times according to the opening and shutting of a shutter 3f located between the slide projector 2 and the filter unit 3.

As mentioned above, the light image output from the slide projector 2 through the filter unit 3 is reflected by either of two reflectors 4, 5 arranged obliquely with respect to a projection direction of the light image from the slide projector 2. The reflector 4 is used for printing of the A4 size and the reflector 5 arranged behind the reflector 4 is used for the A3 size. Two reflectors 4, 5 receive the light projected from the slide projector 2, change the direction of the light as shown in FIGS. 1 and 2(B), and project the light image to a final reflector 6. The final reflector 6 receives the light reflected by the reflector 4 for the A4 size or the reflector 5 for the A3 size, and changes the direction as shown in FIG. 1, and makes an image on an elongated photosensitive microcapsule sheet 8 located along an exposure stand 7 as described below.

Further, a mirror motor 9 for rotating the reflector 4 is operatively connected to the reflector 4 for the A4 size. By driving the mirror motor 9, a print mode is switched between a A4 size print mode where the light image from the slide projector 2 is reflected by the reflector 4 for the A4 size and a A3 size print mode where the light image is reflected by the reflector 5 for the A3 size. When the A4 size is selected as a print size through an input unit 24 shown in FIG. 4, the reflector 4 for the A4 size is moved into a light path LP extended from the slide projector 2. On the other hand, when the A3 size is selected through the input unit 24, the reflector 4 for the A4 size is driven by the mirror motor 9 so that the reflector 4 for the A4 size may be moved away from the light path LP.

Figure 4:
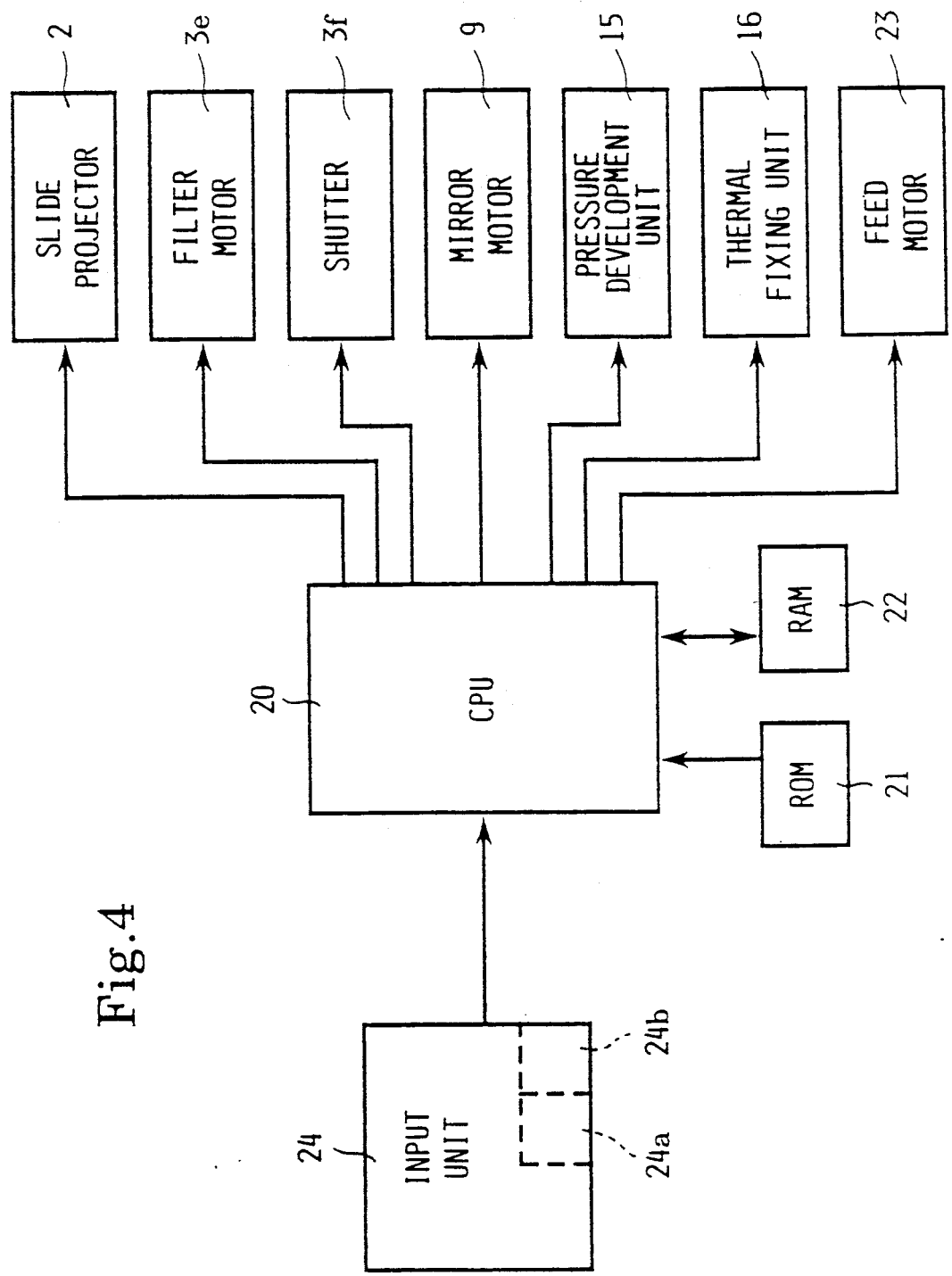
FIG. 4 is a block diagram of a control system used for the slide printer.

The light image reflected by the reflector 4 for the A4 size or the reflector 5 for the A3 size, and further reflected by the final reflector 6 is radiated to the microcapsule sheet 8 supplied from a cartridge 11 in the slide printer. As disclosed in U.S. Pat. No. 4,399,209 and Japanese Patent Laid-Open Sho 58-88739, microcapsules corresponding to three colors, yellow, magenta and cyanogen coated on the microcapsule sheet 8 are adapted to be ruptured by applying pressure to form a visible image of each color or mixed color of them. Plural guide rollers 18, 19 are disposed along a sheet feed path of the microcapsule sheet 8 and a feed motor 23 shown in FIG. 4 is operatively connected to the guide rollers 18, 19 in a well-known manner to rotate the rollers. The microcapsule sheet 8 is fed beneath the exposure stand 7 by the guide rollers 18, 19 and is supplied to a pressure development unit 15 in a superposed fashion with a developer sheet 14 sent from a sheet cassette 12 for the A4 size or a sheet cassette 13 for the A3 size. In the pressure development unit 15, the microcapsule sheet 8 and the developer sheet 14 are pressed by a pair of pressure rollers, and a latent image formed on the microcapsule sheet 8 by the exposure is transferred to the developer sheet 14. The developer sheet 14 with the transferred image thereon is fed to a thermal fixing unit 16. After color development on the developer sheet 14 is promoted and the color image is fixed by the thermal fixing unit 16, the developer sheet 14 is discharged from the slide printer. On the other hand, the microcapsule sheet 8 passed through the pressure development unit 15 is separated from the developer sheet 14 by a separation roller 25 shown in FIG. 2(A), and then is wound around a takeup reel 17.

Figure 3:
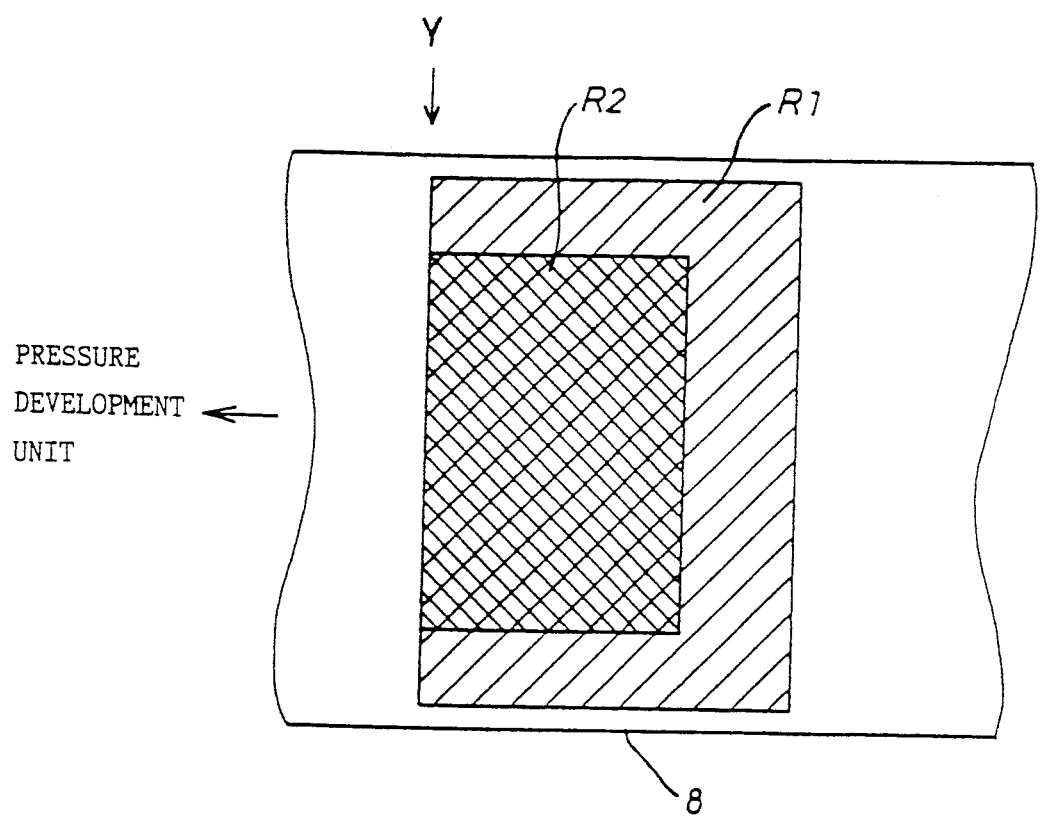
FIG. 3 is a view for illustrating the position of each exposure area for the A3 size and for the A4 size.

Besides, when the mirror motor 9 is driven for the A4 size print mode, the reflector 4 for the A4 size is positioned in such a positional relation that a center line of an exposure area R2 of the light image projected through the reflector 4 for A4 size is offset from a center line of an exposure area R1 of the light image projected through the reflector 5 for A3 size, in a forward feeding direction that the microcapsule sheet 8 is fed from the cartridge 11 to the takeup reel 17. Particularly, as shown in FIG. 3, the exposure area R2 is arranged in the nearest position to the pressure development unit 15 on the sheet feed path of the microcapsule sheet 8, and a left edge of the exposure area R2 is set at the same position as a left edge of the exposure area R1 which is a maximum exposure area in this embodiment.

Figure 5:
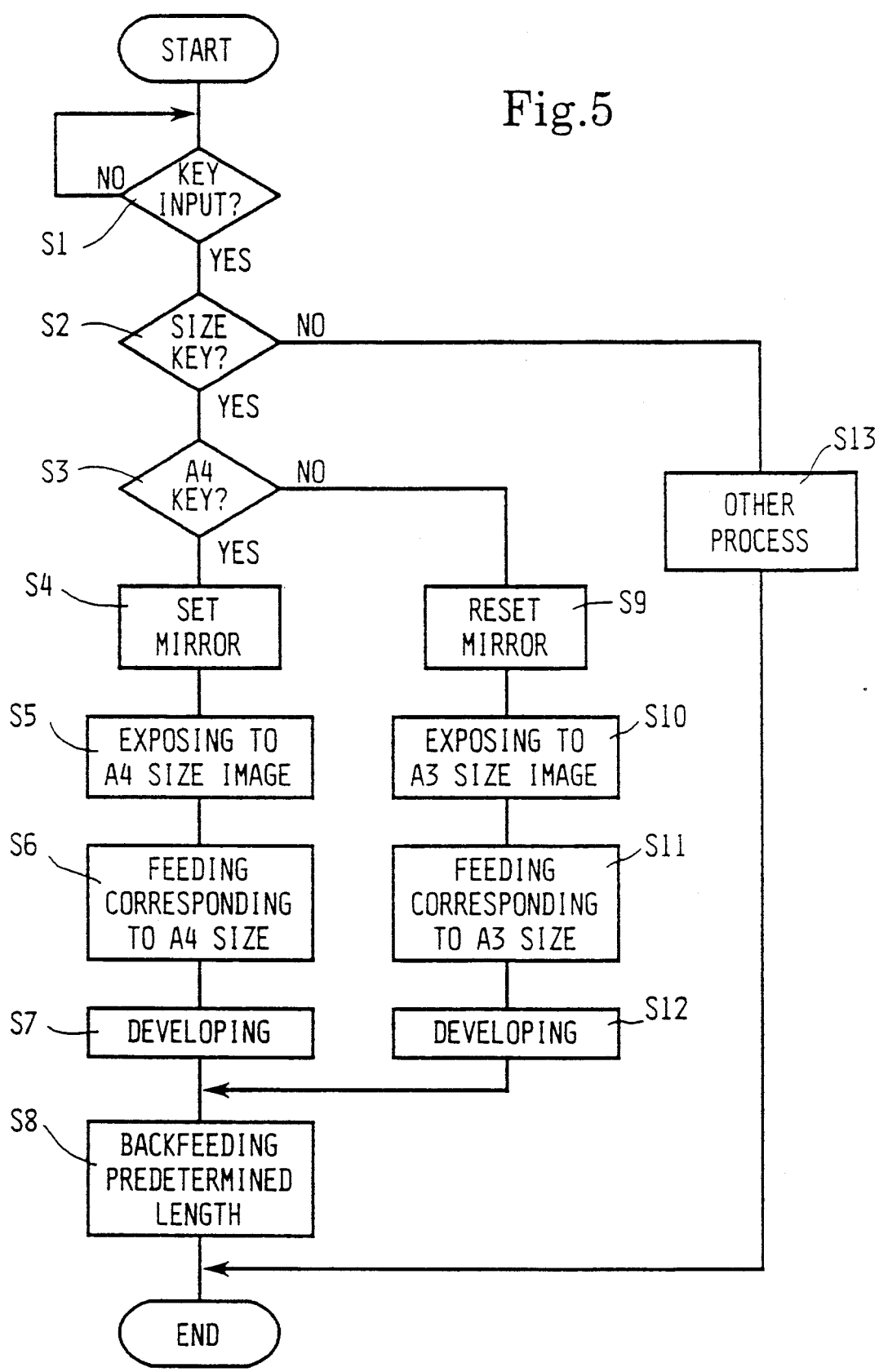
FIG. 5 is a flowchart showing the routine of the image forming process by the slide printer.
Figure 6:
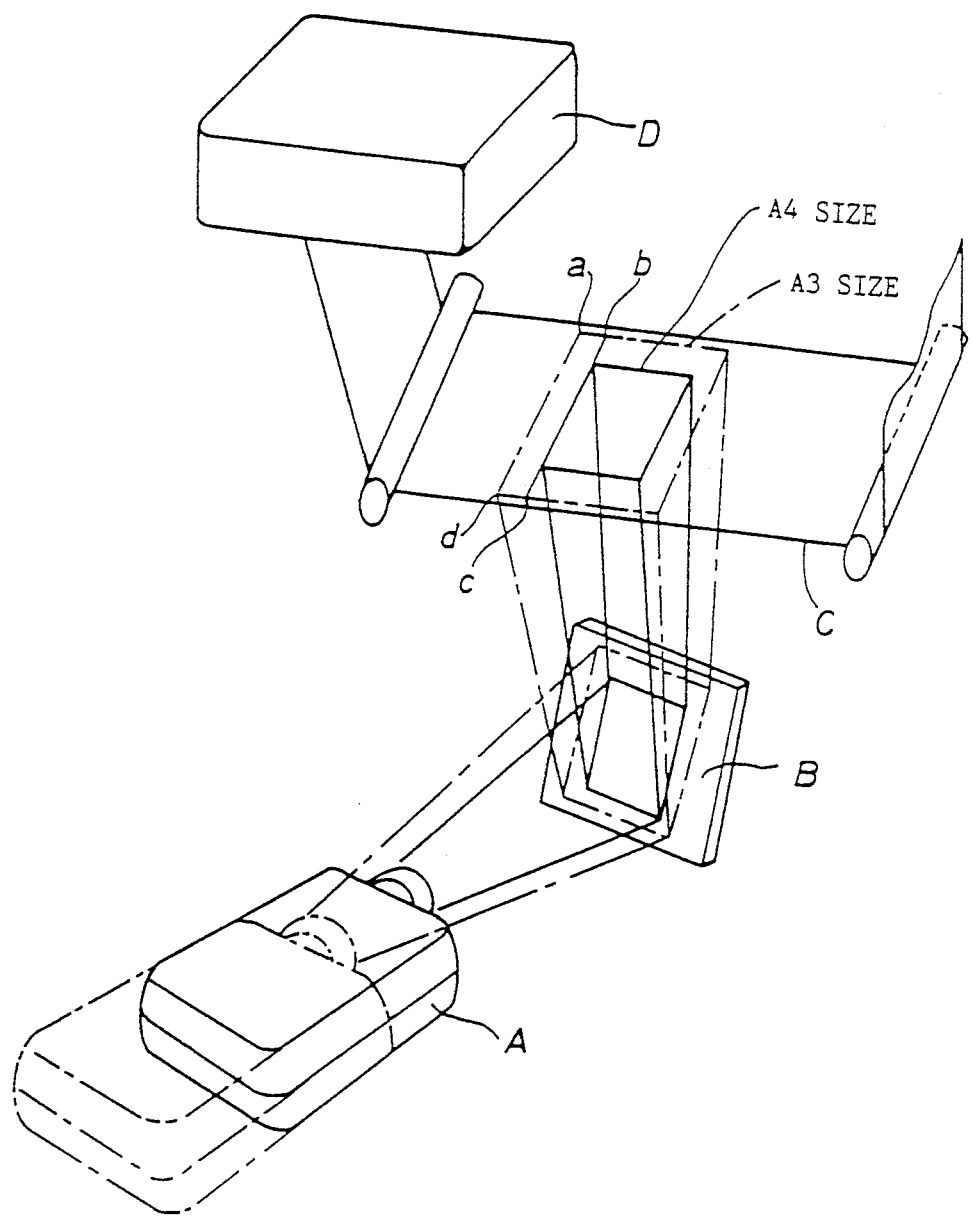
FIG. 6 is a perspective view showing a conventional slide printer.

A control system of the slide printer 1 is explained with reference to FIG. 4A. A CPU 20 is connected to ROM 21, RAM 22, the slide projector 2, the filter motor 3e, the shutter 3f, the mirror motor 9, the pressure development unit 15, the thermal fixing unit 16, the feed motor 23 for feeding or backfeeding the microcapsule sheet 8 and the input unit 24 including an A4 key 24a and a A3 key 24b. In ROM 21, various programs such as a control program shown by a flowchart in FIG. 5 are stored.

Next, a series of the image forming operation of the slide printer 1 of this embodiment thus constructed is explained with reference to FIG. 1 through FIG. 5.

If the A4 key 24a is depressed (step S1:YES, S2:YES, S3:YES), CPU 20 drives and controls the mirror motor 9 so that the reflector 4 for the A4 size may be positioned at a predetermined position in the light path LP (S4). Afterwards, the slide projector 2 is operated, and the shutter 3f and the filter motor 3e are driven and one light image is projected four times toward the reflector 4 for the A4 size. As a result, the projected light is reflected by the reflector 4 for the A4 size, and is directed to the final reflector 6. Further, the projected light is reflected by the final reflector 6, and the predetermined exposure area R2 on the microcapsule sheet 8 is exposed to the projected light (S5). Then CPU 20 drives and controls the feed motor 23 for feeding the microcapsule sheet 8 by a forward feeding amount corresponding to A4 size until a trailing edge (a right edge in FIG. 3) of the exposure area R2 of the microcapsule sheet 8 reaches a point X downstream of the separation roller 25 as shown in FIG. 2(A) (S6). When, during the forward feeding, a leading edge (the left edge in FIG. 3) of the exposure area R2 of the microcapsule sheet 8 reaches the development unit 15, the CPU 20 operates the development unit 15 so that the pair of pressure rollers are engaged with each other for pressure development. The pressure development is continued until the trailing edge of the exposure area R2 has passed through the development unit 15. Afterwards, the CPU 20 disables the development unit 15 so that the pair of pressure rollers are spaced from each other. By the pressure development, the latent image formed within the exposure area R2 of the microcapsule sheet 8 is transferred to the developer sheet 14 (S7). Then, the color image is fixed in the thermal fixing unit 16, and the output image of the A4 size is obtained. After the forward feeding, CPU 20 drives and controls the feed motor 23 for backfeeding the non-exposure microcapsule sheet 8 by a backward feeding amount predetermined on the basis of a length from the point X to a point Y shown in FIG. 2(A) where the left edge of the exposure area R2 is set beneath the exposure stand 7. Thus, this backfeeding prevents the non-exposed part of microcapsule sheet 8 from remaining in front of the next exposure area (S8). While the non-exposed area passes through the development unit 15, the CPU 20 keeps the pressure development unit 15 disabled.

On the other hand, if the A3 key 24b is depressed (S3:NO), CPU 20 drives and controls the mirror motor 9 so that the reflector 4 for the A4 size may be moved away from the light path LP (S9). Afterwards, the slide projector 2 is operated and the light image is projected toward the reflector 5 for the A3 size. The projected light is reflected by the reflector 5 for the A3 size, and then the predetermined exposure area R1 on the microcapsule sheet 8 is exposed to the projected light through the final reflector 6 (S10). Then CPU 20 drives and controls the feed motor 23 for feeding the microcapsule sheet 8 by a forward feeding amount corresponding to A3 size until a trailing edge (a right edge in FIG. 3) of the exposure area R1 of the microcapsule sheet 8 reaches the point X shown in FIG. 2(A) (S11). When a leading edge (the left edge in FIG. 3) of the exposure area R1 of the microcapsule sheet 8 reaches the development unit 15, the CPU 20 causes the pressure rollers of the development unit 15 to be engaged with each other. The pressure development is promoted only when the exposure area R1 passes through the development unit 15. After the trailing edge of the exposure area R1 has passed through the development unit 15, the CPU 20 disables the development unit 15 so that the pressure rollers are spaced from each other (S12). Subsequently, the color image is fixed in the thermal fixing unit 16 and the output image of the A3 size is obtained. After the forward feeding, CPU 20 drives and controls the feed motor 23 for backfeeding the non-exposed part of microcapsule sheet 8 by the predetermined backward feeding amount corresponding to the length from the point X to the point Y shown in FIG. 2(A) in order not to leave the non-exposure part in front of the next exposure area (S8). While the non-exposed area passes through the development unit 15, the pressure development unit 15 is kept disabled.

In case that the size key is not depressed (S2:NO), other processes are executed (S13).

As mentioned above, according to the slide printer 1 of this embodiment, in case that the A4 size smaller than the A3 size, that is the maximum size, is printed, the microcapsule sheet 8 is never sent to the pressure development unit 15 with a non-exposed part left in front of the exposure area. This is because the light image is radiated to the nearest position to the pressure development unit 15 on the sheet feed path of the microcapsule sheet 8 within the exposure area R1 for the print of the A3 size. As a result, the nonuse of the microcapsule sheet 8 can be prevented and the microcapsule sheet 8 can be used effectively.

In the slide printer 1 of this embodiment, the print of the A4 size and A3 size is described. Further, the slide printer may be constituted for printing other sizes such as the B4 size and the B5 size and may be equipped with a plurality of reflectors corresponding to these sizes. While in this embodiment, the microcapsule sheet 8 of a transfer type requiring the developer sheet 14 is used, alternatively a microcapsule sheet of a selfactivated type may be used. While this invention has been described with reference to the above-mentioned embodiment, this invention is not limited to such an embodiment. This invention is possible to be executed by various modes within the scope which do not exceed the scope of this invention, for example, to execute to the copier instead of the slide printer.

Thus, while this invention has been described in conjunction with specific embodiments thereof, many alternatives, modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. An image forming apparatus comprising:
   means for storing an elongated photosensitive recording medium;
   feed means for feeding the photosensitive recording medium from the storing means along a predetermined feed path;
   exposure means for exposing the photosensitive recording medium to a light image, the exposure means having an exposure position downstream of the storing means in the feed path;
   development means, disposed downstream of the exposure position in the feed path, for developing an exposed portion of the photosensitive recording medium to form a visible output image;
   size selection means for selecting a desired size of the visible output image from among plural different image sizes including a maximum image size; and
   exposure area setting means for setting an exposure area to be exposed to the light image on the photosensitive recording medium placed at the exposure position, the exposure area corresponding to the image size selected by the size selection means, wherein a center line of the exposure area corresponding to the image size smaller than the maximum image size is offset from a center line of the exposure area corresponding to the maximum image size in a downstream direction of the feed path.

2. The image forming apparatus as recited in claim 1, wherein the exposure area setting means includes plural different light paths for providing the light image to the photosensitive recording medium placed at the exposure position, and light path selection means for selecting one from among the plural different light paths according to the image size selected by the size selection means.

3. The image forming apparatus as recited in claim 2, wherein the light path selection means includes a light transmitting member movable to define the plural different light paths and a driving motor connected to the light transmitting member for setting the light transmitting member to plural different positions.

4. The image forming apparatus as recited in claim 3, wherein one of the plural different light paths is a reference light path for providing the light image to the exposure area corresponding to the maximum image size, and the driving motor moves the light transmitting member into the reference light path to form at least one light path having a length different from that of the reference light path.

5. The image forming apparatus as recited in claim 4, wherein the driving motor moves the light transmitting member away from the reference light path to select the reference light path.

6. The image forming apparatus as recited in claim 5, wherein the light transmitting member is a light reflecting member.

7. The image forming apparatus as recited in claim 1, wherein the development means forms the visible output image on a recording sheet by bringing the recording sheet in contact with the photosensitive recording medium.

8. The image forming apparatus as recited in claim 1, further comprising rewinding means for feeding the photosensitive recording medium backward to the exposure means until an unexposed portion following an exposed portion of the photosensitive recording medium reaches the exposure position after the exposed portion has been developed by the development means.

9. The image forming apparatus as recited in claim 8, wherein the development means forms the visible output image on a recording sheet by bringing the recording sheet in contact with the photosensitive recording medium, further comprising separation means, disposed downstream of the development means in the feed path, for separating the photosensitive recording medium and the recording sheet from each other, and wherein the rewinding means feeds to the exposure position the unexposed portion following the exposed portion of the photosensitive recording medium which has been developed and then separated from the recording sheet.

10. The image forming apparatus as recited in claim 1, wherein the exposure area corresponding to each of the plural different image sizes has opposite edges traversing the feed path, and the exposure area setting means sets the exposure area so that one of the opposite edges closer to the development means is positioned at a predetermined position.

11. An image forming apparatus comprising:
means for storing an elongated photosensitive recording medium;
feed means for feeding the photosensitive recording medium from the storing means along a predetermined feed path;
exposure means for exposing the photosensitive recording medium to a light image, the exposure means having an exposure position downstream of the storing means in the feed path;
development means, disposed downstream of the exposure position in the feed path, for developing an exposed portion of the photosensitive recording medium to form a visible output image;
size selection means for selecting a desired size of the visible output image from among a first image size and at least one second image size smaller than the first image size;
first light path setting means for leading the light image to the photosensitive recording medium placed at the exposure position when the first image size is selected by the size selection means and for setting a first exposure area to be exposed to the light image corresponding to the first image size on the photosensitive recording medium; and
second light path setting means for leading the light image to the photosensitive recording medium placed at the exposure position when the second image size is selected by the size selection means and for setting a second exposure area to be exposed to the light image corresponding to the second image size on the photosensitive recording medium so that the second exposure area is arranged within the first exposure area and in the nearest position to the development means in the feed path of the photosensitive recording medium.

12. An image forming apparatus comprising:
means for storing an elongated photosensitive recording medium;
feed means for feeding the photosensitive recording medium from the storing means along a predetermined feed path;
exposure means for exposing the photosensitive recording medium to a light image, the exposure means having an exposure position downstream of the storing means in the feed path;
development means, disposed downstream of the exposure position in the feed path, for forming a visible output image on a recording sheet by bringing the recording sheet into contact with an exposed portion of the photosensitive recording medium;
separation means, disposed downstream of the development means in the feed path, for separating the photosensitive recording medium from the recording sheet;
rewinding means for feeding the photosensitive recording medium backward to the exposure means until an unexposed portion following the exposed portion of the photosensitive recording medium reaches the exposure position after the exposed portion has been separated from the recording sheet;
size selection means for selecting a desired size of the visible output image from among plural different image sizes including a maximum image size; and
exposure area setting means for setting an exposure area to be exposed to the light image on the photosensitive recording medium placed at the exposure position, the exposure area corresponding to the image size selected by the size selection means, wherein a center line of the exposure area corresponding to the image size smaller than the maximum image size is offset from a center line of the exposure area corresponding to the maximum image size in a downstream direction of the feed path.

13. The image forming apparatus as recited in claim 12, wherein the exposure area corresponding to each of the plural different image sizes has opposite edges traversing the feed path, and the exposure setting means sets the exposure area so that one of the opposite edges closer to the development means is positioned at a predetermined position.

14. The image forming apparatus as recited in claim 12, wherein the exposure area setting means includes plural different light paths for providing the light image to the photosensitive recording medium placed at the exposure position, and light path selection means for selecting one from among the plural different light paths according to the image size selected by the size selection means.

15. The image forming apparatus as recited in claim 14, wherein the light path selection means includes a light transmitting member movable to define the plural different light paths and a driving motor connected to the light transmitting member for setting the light transmitting member to plural different positions.

16. The image forming apparatus as recited in claim 15, wherein one of the plural different light paths is a reference light path for providing the light image to the exposure area corresponding to the maximum image size, and the driving motor moves the light transmitting member into the reference light path to form at least one light path having a length different from that of the reference light path.

17. The image forming apparatus as recited in claim 16, wherein the driving motor moves the light transmitting member away from the reference light path to select the reference light path.

18. The image forming apparatus as recited in claim 17, wherein the light transmitting member is a light reflecting member.

* * * * *